United States Patent
Eynon

(10) Patent No.: US 6,524,754 B2
(45) Date of Patent: Feb. 25, 2003

(54) FUSED SILICA PELLICLE

(75) Inventor: Ben Eynon, Rand Rock, TX (US)

(73) Assignee: Photronics, Inc., Brookfield, CT (US)

( * ) Notice: Subject to any disclaimer, the term of this patent is extended or adjusted under 35 U.S.C. 154(b) by 27 days.

(21) Appl. No.: 09/766,907

(22) Filed: Jan. 22, 2001

(65) Prior Publication Data

US 2002/0098420 A1 Jul. 25, 2002

(51) Int. Cl.[7] ................................................. G03F 9/00
(52) U.S. Cl. ........................................................ 430/5
(58) Field of Search ............................ 430/5; 428/14; 355/76

(56) References Cited

U.S. PATENT DOCUMENTS

| | | |
|---|---|---|
| 4,269,654 A | 5/1981 | Deckert et al. |
| 4,482,591 A | 11/1984 | Ward |
| 4,499,231 A | 2/1985 | Ward et al. |
| 4,889,586 A | 12/1989 | Noguchi et al. |
| 4,996,106 A | 2/1991 | Nakagawa et al. |
| 5,159,039 A | 10/1992 | Kolesinski |
| 5,234,742 A | 8/1993 | Hatano et al. |
| 5,286,567 A | 2/1994 | Kubota et al. |
| 5,339,197 A | 8/1994 | Yen |
| 5,370,951 A | 12/1994 | Kubota et al. |
| 5,378,514 A | 1/1995 | Hamada et al. |
| 5,419,972 A | 5/1995 | Kawaguchi et al. |
| 5,449,742 A | 9/1995 | Beuhler et al. |
| 5,453,816 A | 9/1995 | Wang |
| 5,470,621 A | 11/1995 | Kashida et al. |
| 5,529,819 A | 6/1996 | Campi, Jr. |
| 5,576,125 A | 11/1996 | Bih |
| 5,597,669 A | 1/1997 | Hamada et al. |
| 5,616,927 A | 4/1997 | Kubota et al. |
| 5,643,654 A | 7/1997 | Fujita et al. |
| 5,656,342 A | 8/1997 | Kashida |
| 5,674,624 A | 10/1997 | Miyazaki et al. |
| 5,691,088 A | 11/1997 | Kubota et al. |
| 5,693,382 A | 12/1997 | Hamada et al. |
| 5,719,976 A | 2/1998 | Henry et al. |
| 5,723,860 A | 3/1998 | Hamada et al. |
| 5,729,325 A | 3/1998 | Kashida |
| 5,741,576 A | 4/1998 | Kuo |
| 5,814,381 A | 9/1998 | Kuo |
| 5,834,143 A | 11/1998 | Matsuoka et al. |
| 5,976,620 A | 11/1999 | Sanada et al. |
| 5,999,290 A | 12/1999 | Li |
| 6,055,040 A | 4/2000 | Sego |
| 6,197,454 B1 * | 3/2001 | Yan ............................ 430/5 |

FOREIGN PATENT DOCUMENTS

| | | |
|---|---|---|
| JP | S 62-288842 | 12/1987 |
| JP | S 63-006553 | 1/1988 |

* cited by examiner

*Primary Examiner*—S. Rosasco
(74) *Attorney, Agent, or Firm*—Amster, Rothstein & Ebenstein

(57) ABSTRACT

A fused silica pellicle for use on photomasks having increased durability and improved transmission uniformity and birefringence properties. The pellicle may be secured to the photomask using an adhesive or a slide rail system, or may be held in place using a static charge.

36 Claims, 3 Drawing Sheets

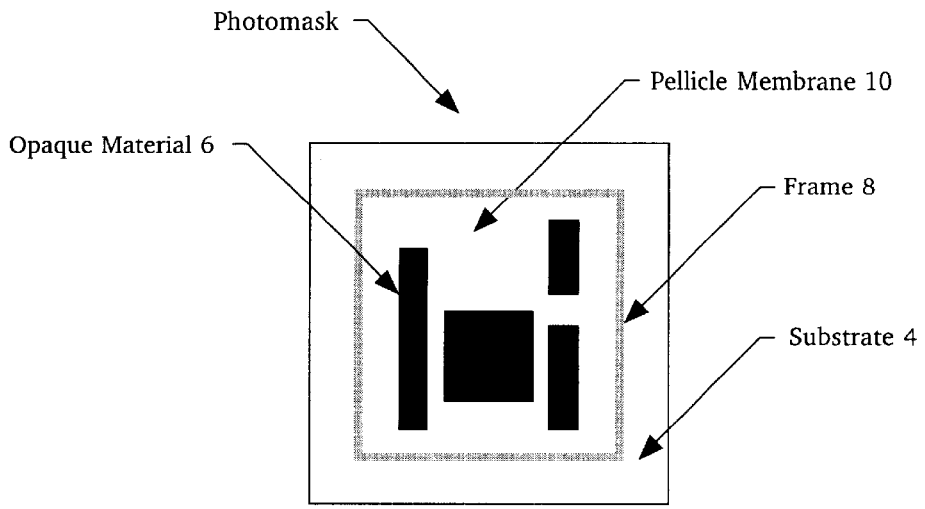
FIG. 1A - TOP VIEW OF PHOTOMASK
(PRIOR ART)
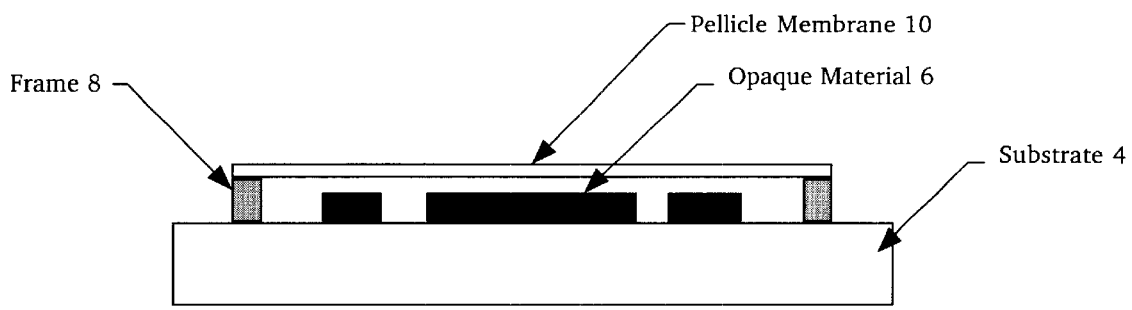
FIG. 1B - CROSS SECTIONAL VIEW OF PHOTOMASK
(PRIOR ART)

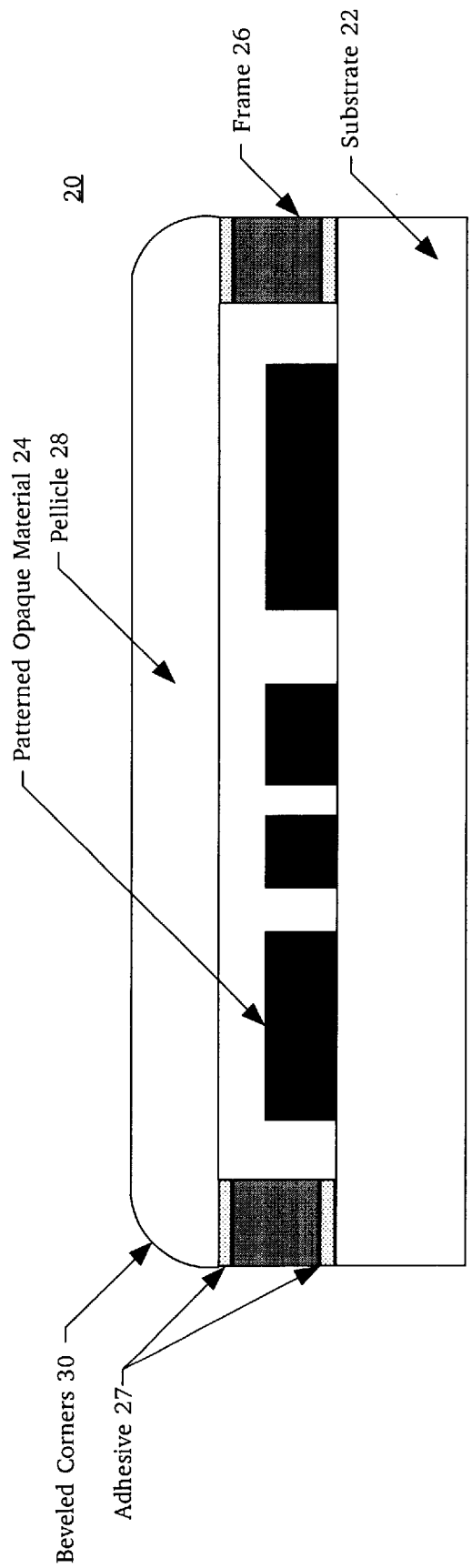
FIG. 2 - Cross Sectional View of Photomask With Fused Silica Pellicle

FUSED SILICA PELLICLE

BACKGROUND OF INVENTION

Photomasks, also called masks, are used in the semiconductor industry to transfer micro-scale images defining a semiconductor circuit onto a silicon or gallium arsenide wafer. In general, a photomask is comprised of a transparent substrate to which a masking material layer is affixed and patterned. The pattern of the masking material is a scaled master of the image desired to be formed on the semiconductor wafer.

The transfer the photomask image to the semiconductor wafer occurs through a process commonly referred to as photolithography. More specifically, a wafer exposure system is used to interpose the photomask between a semiconductor wafer which is coated with a layer of photosensitive material and an optical energy source. Energy from the wafer exposure system is inhibited from passing through the areas of the photomask in which the masking material is present. However, energy generated by the water exposure system passes through the portions of the substrate of the photomask not covered by the masking material and causes a reaction in the photosensitive material on the semiconductor wafer. Through subsequent processing, the image created on the photosensitive material is transferred to the semiconductor wafer.

Since the masking image on the photomask directly correlates to the image created in the semiconductor wafer, any foreign substance or contamination on the surface of the mask during the photolithographic process will cause unwanted images of these artifacts to be printed on the semiconductor wafer. To reduce or eliminate photomask surface contamination, a thin, transparent membrane or film commonly referred to as a pellicle is stretched across an anodized aluminum frame mounted on the photomask before the photolithographic process is begun.

FIGS. 1A and 1B depict a top and side view of a typical photomask configured for use in the photolithographic process. As shown, photomask 2 (typically six inches by six inches in size and one-quarter inch thick) is comprised of transparent substrate 4 (e.g., fused silica) and the pattern layer of masking material 6 (e.g., chromium) defining the desired image to be created on the semiconductor wafer. Pellicle frame 8 extends around the perimeter of the patterned masking material 6 and is affixed to the substrate 4 via vapor deposition as well known in the art. Pellicle membrane 10 is stretched over and affixed to the upper surface of frame 8. As shown, the surface of pellicle membrane 10 is generally parallel to the surface of the photomask and covers the entire patterned area of masking material 6. Thus, any contamination which would otherwise land on the photomask instead falls on the pellicle membrane 10 staying out of the wafer exposure system focal plane.

Pellicle membranes known in the prior art are made of organic material such as nitocellulose or other fluorocarbon based polymers. Non-uniformities in transmission and birefringence caused by pellicle membranes result in pattern fidelity errors which become more prevalent when feature sizes patterned into the semiconductor wafer are in the sub-wavelength regime and may ultimately result in diminished device performance or failure.

The prior art pellicle membranes are susceptible to being scratched and torn, and any damage to the thin pellicle membrane requires the entire pellicle to be removed and replaced. Of course, during the time the pellicle membrane is being removed and replaced, the photomask cannot be used for semiconductor fabrication. Additionally, the extensive rework procedure required to remove and replace damaged pellicles sometimes results in the ultimate rejection of the entire photomask. Further, as discussed above, the pellicle membrane 10 prevents contaminants from reaching the photomask surface and therefore must be cleaned occasionally. Pellicles are typically cleaned using a nitrogen gun. However, due to their somewhat fragile nature, the prior art pellicle membranes have a propensity to break or otherwise become damaged during the cleaning process requiring their removal and replacement. Also, defects that cannot be removed with a nitrogen gun also cannot be removed mechanically for fear or scratching or tearing the membrane. Here again, during the pellicle replacement process, the photomasks cannot be used for semiconductor fabrication and there is a risk of rejection of the entire photomask

SUMMARY OF INVENTION

Accordingly, it is the object of the present invention to overcome the shortcoming of the prior art by providing a pellicle for use on a photomask having improved uniformity of transmission and birefringence thereby increasing pattern fidelity.

It is a further object of the present invention to provide a pellicle which is less susceptible to damage and therefore can be easily cleaned.

It is a further object of the present invention to provide a reusable pellicle which can be easily removed, cleaned, and re-installed on a photomask.

BRIEF DESCRIPTION OF DRAWINGS

FIG. 1A is a cross-sectional view of a prior art photomask configured for use in a photolithographic process.

FIG. 1B is a top-level view of a prior art photomask configured for use in a photolithographic process.

FIG. 2 is a cross-sectional view of a photomask configured in accordance with the present invention for use in a photolithographic process.

Figure 3:
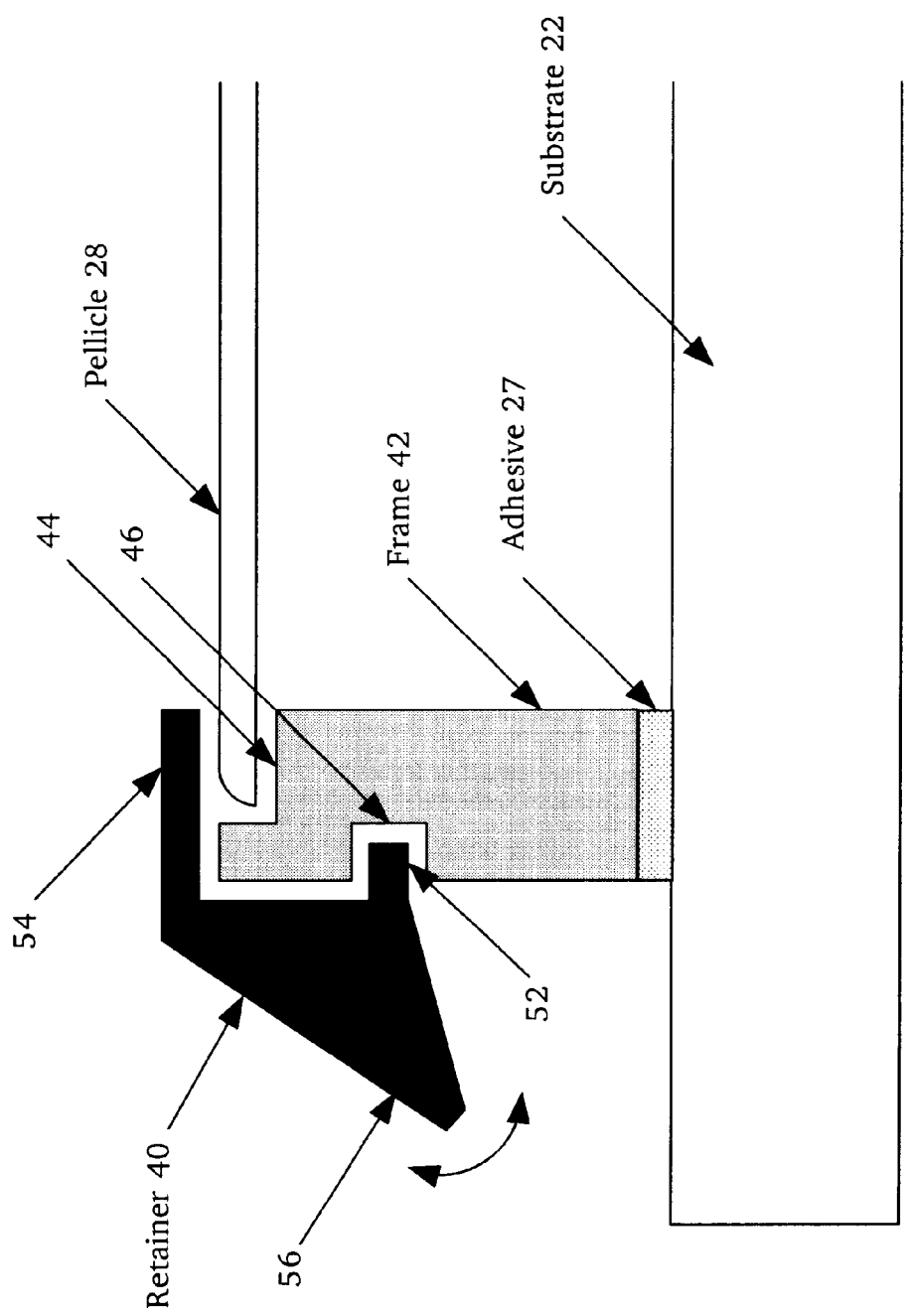
FIG. 3 is a cross-sectional view of a photomask configured in accordance with the present invention having a removable frame assembly.

It will be appreciated by those skilled in the art that FIGS. 1A through 3 are for illustrative purposes and therefore are not per scale.

DETAILED DESCRIPTION OF THE INVENTION

FIG. 2 depicts a photomask configured in accordance with the present invention. As shown, photomask 20 comprises a substantially transparent substrate 22 to which a patterned layer of masking material 24 is affixed. The pattern layer of masking material 24 represents a scaled image of the pattern desired to be created on the semiconductor wafer. As discussed above, the substrate may be comprised of fused silica and the masking material may be comprised of chromium. Those skilled in the art will understand that other materials are used to create photomasks, and that the present invention is not limited for use with photomasks having fused silica substrates and chromium masking material. Further, those skilled in the art will understand that the pellicle of the instant invention can be used in conjunction with all types of photomasks including, but not limited to, binary masks (discussed above) and phase shift masks (PSM).

Again with reference to FIG. 2, photomask 20 also includes a pellicle frame or ring 26 which extends around the perimeter of the patterned masking material 24. In the preferred embodiment frame 26 is made from anodized aluminum, however, other materials may be used as well. Although shown as a continuous ring, such is not a requirement of the present invention, and frame 26 may include various gaps or vents to ensure that pressure comes to equilibrium at the end user site. Frame 26 is affixed to substrate 22 using adhesive 27, types of which being well known in the art.

Pellicle 28 is comprised of a flat, polished, low birefringence slice of fused silica dimensioned to generally conform to the dimensions of frame 26. One or more of the edges or corners 30 of the fused silica pellicle 28 may be beveled or rounded for safety reasons. The overall thickness of fused silica pellicle 28 may be varied, the only restriction being that the overall thickness of the photomask frame 26, adhesive 27, and pellicle 28 be such that the entire assembly fit in the wafer exposure system. Typically this would require the overall thickness of the assembly to be less than or equal to 7 mm. In general, the thicker the fused silica pellicle the more durable it will be.

The fused silica pellicle 28 may be affixed to the upper surface of frame 26 using adhesives which are well known in the art which may include, e.g., SAG, acrylics and SEBs. Alternatively to enhance removeability, the fused silica pellicle may to affixed to the upper surface of frame 26 using a reusable adhesive examples of which are known in the art. Additionally, pellicle 28 may be secured to the upper surface of frame 26 by means of a static charge.

In yet another embodiment, the pellicle may be secured to the frame using a removable frame assembly so that the pellicle can be easily removed and cleaned. For example, as shown in the cross-sectional view of FIG. 3, frame 42 made from anodized aluminum is affixed to substrate 22 by means of an adhesive, applicable types of which being well known in the art. Those skilled in the art will understand frame 42 can be made from materials other than anodized aluminum. In the preferred embodiment frame 42 extends around the entire perimeter of the patterned masking material, however, frame 42 need not be contiguous and may include one or more gaps. Frame 42 includes a first receptive area 44 which forms a shelf parallel to the surface of substrate 22 for receiving the lower surface of the outer edges of pellicle 28. Frame 42 also includes a second receptive area or detent 46 which receives lower protrusion 52 of flexible retainer 50 which may be constructed from a variety of materials including plastics and teflon. An upper protrusion 54 of retainer 50 extends over the first receptive area 44 of frame 42 and over the upper surface of the outer edge of pellicle 28 thereby holding pellicle 28 securely in place. Accordingly, in this embodiment there is no need to for adhesive to affix the pellicle to the frame. For aid in the installation and removal of flexible retainer 50, the corners of retainer 50 may include flexible tabs 56. When an upward force is exerted on flexible tabs 56, lower protrusion 52 is decoupled from second receptive area 46 of frame 42. With lower protrusion 52 decoupled from frame 42, retainer 50 can be removed thereby enabling pellicle 28 to be removed as well.

In this embodiment, no vent is necessary in frame 42 since pressure can be relieved through the gaps between frame 42, pellicle 28, and retainer 50. Additionally, since no adhesive is used to secure the pellicle to the frame, the pellicle can be more readily removed, cleaned, and/or replaced.

Various additional modifications and improvements thereon will become readily apparent to those skilled in the art. For example, rather than be comprised of fused silica, the pellicle may be made from F-doped fused silica for 157 nm applications or $Si_3N_4$ for EPL and NGL applications. Accordingly, the spirit and scope of the present invention is to be construed broadly and limited only by the appended claims, and not by the foregoing specification.

What is claimed is:

1. A photomask for use in semiconductor fabrication, said photomask comprising:

(a) a substantially transparent substrate, (b) a patterned area of masking material affixed to said substrate, (c) a frame affixed to said substrate surrounding substantially all of said patterned area of masking material, and (d) a silica pellicle affixed to said frame.

2. The photomask of claim 1 wherein said pellicle is a fused silica pellicle.

3. The photomask of claim 1 wherein said pellicle is made from F-doped fused silica.

4. The photomask of claim 1 wherein said pellicle is made from $Si_3N_4$.

5. The photomask of claim 1 wherein said silica pellicle is affixed to said frame using an adhesive.

6. The photomask of claim 1 wherein said silica pellicle is affixed to said frame using a reusable adhesive.

7. A photomask for use in printing images on semiconductor wafers, said photomask comprising:

(a) a substantially transparent substrate, (b) a patterned area of masking material affixed to said substrate, (c) a frame having an upper and a lower surface surrounding substantially all of said patterned area of masking material, said lower surface being affixed to said substrate and said upper surface of said frame extending above said patterned area of masking material, and (d) a silica pellicle secured to said upper surface of said frame.

8. The photomask of claim 7 wherein said pellicle is a fused silica pellicle.

9. The photomask of claim 7 wherein said pellicle is made from F-doped fused silica.

10. The photomask of claim 7 wherein said pellicle is made from $Si_3N_4$.

11. The photomask of claim 7 wherein said silica pellicle is secured to said frame using an adhesive.

12. The photomask of claim 7 wherein said silica pellicle is secured to said frame using a reusable adhesive.

13. The photomask of claim 7 wherein said silica pellicle is secured to said frame using a static charge.

14. The photomask of claim 7 wherein said silica pellicle is secured to said frame using a flexible retainer ring.

15. The photomask of claim 7 wherein said flexible retainer ring includes a first protrusion for coupling said flexible retainer ring to a first receptive area of said frame and a second protrusion extending over the outer edge of said pellicle.

16. The photomask of claim 15 wherein said flexible retainer ring includes at least one flexible tab.

17. A photomask for use in creating images on semiconductor wafers, said photomask comprising:

(a) a substantially transparent substrate, (b) a patterned area of masking material affixed to said substrate, (c) a frame affixed to said substrate surrounding substantially all of said patterned area of masking material, (d) a fused silica pellicle, and (e) means for securing said fused silica pellicle to said frame.

18. The photomask of claim 17 wherein said pellicle is a fused silica pellicle.

19. The photomask of claim 17 wherein said pellicle is made from F-doped fused silica.

20. The photomask of claim 17 wherein said pellicle is made from $Si_3N_4$.

21. The photomask of claim 17 wherein said silica pellicle is secured to said frame using an adhesive.

22. The photomask of claim 17 wherein said silica pellicle is secured to said frame using a reusable adhesive.

23. The photomask of claim 17 wherein said silica pellicle is secured to said frame using a static charge.

24. The photomask of claim 17 wherein said fused silica pellicle is secured to said frame using a flexible retainer ring.

25. The photomask of claim 24 wherein said flexible retainer ring includes a first protrusion for coupling said flexible retainer ring to a first receptive area of said frame and a second protrusion extending over the outer edge of said pellicle.

26. The photomask of claim 25 wherein said flexible retainer ring includes at least one flexible tab.

27. A photomask used in semiconductor fabrication, said photomask comprising:

(a) a substantially planar substrate having an upper and a lower surface, (b) a patterned area of masking material affixed to said upper surface of said substrate, said masking material having a maximum height $h_1$ above said substrate, (c) a frame affixed to said upper surface of said substrate and surrounding substantially all of said patterned area of masking material, (d) a silica pellicle having an upper and lower surface secured to said frame and covering substantially all of said patterned area of masking material, wherein said frame includes a receptive area of height $h_2$ substantially parallel to said upper surface of said substrate for receiving the lower surface of the outer edges of said pellicle, wherein the height of said receptive area $h_2$ is greater than the height of masking material $h_1$, and (e) means for securing said pellicle to said frame.

28. The photomask of claim 27 wherein said silica pellicle is secured to said receptive area of said frame using an adhesive.

29. The photomask of claim 27 wherein said silica pellicle is secured to said receptive area of said frame using a reusable adhesive.

30. The photomask of claim 27 wherein said silica pellicle is secured to said receptive area of said frame using a static charge.

31. The photomask of claim 27 wherein said silica pellicle is secured to said frame using a flexible retainer ring.

32. The photomask of claim 31 wherein said flexible retainer ring includes a first protrusion for coupling with a detent in said frame and a second protrusion extending over the upper surface of the outer edges of said pellicle.

33. The photomask of claim 31 wherein said flexible retainer ring includes at least one flexible tab.

34. The photomask of claim 27 wherein said pellicle is a fused silica pellicle.

35. The photomask of claim 27 wherein said pellicle is made from F-doped fused silica.

36. The photomask of claim 27 wherein said pellicle is made from $Si_3N_4$.

* * * * *